US012655855B2

(12) United States Patent
Huangfu et al.

(10) Patent No.: US 12,655,855 B2
(45) Date of Patent: Jun. 16, 2026

(54) VENTILATION AND PROTECTION GRID FOR FAN MODULE

(71) Applicant: SCHNEIDER ELECTRIC IT CORPORATION, Foxboro, MA (US)

(72) Inventors: Bo Huangfu, Shanghai (CN); Chenlei Bao, Shanghai (CN); Yanli Zhang, Shanghai (CN)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 10 days.

(21) Appl. No.: 18/812,437

(22) Filed: Aug. 22, 2024

(65) Prior Publication Data

US 2025/0067280 A1    Feb. 27, 2025

(30) Foreign Application Priority Data

Aug. 25, 2023    (CN) .......................... 202311083007.X

(51) Int. Cl.
*F04D 29/70* (2006.01)
*F04D 29/64* (2006.01)
*H05K 7/20* (2006.01)

(52) U.S. Cl.
CPC ......... *F04D 29/703* (2013.01); *F04D 29/646* (2013.01); *H05K 7/20172* (2013.01)

(58) Field of Classification Search
CPC ...... F04D 29/703; F04D 29/646; F04D 25/08; H05K 7/20172; H05K 7/20181
See application file for complete search history.

(56) References Cited

U.S. PATENT DOCUMENTS

| | | | |
|---|---|---|---|
| 6,215,660 B1 | 4/2001 | Lin | |
| 6,749,398 B2 * | 6/2004 | Lu .......................... | F04D 29/703 |
| | | | 415/121.2 |
| 7,778,013 B2 | 8/2010 | Bruski et al. | |
| 10,208,769 B2 | 2/2019 | Cao et al. | |
| 11,019,748 B2 * | 5/2021 | Avvaru ................ | H05K 7/1489 |
| 11,096,314 B2 * | 8/2021 | Gupta ................ | H05K 7/20172 |
| 11,280,352 B2 | 3/2022 | Zhang | |

(Continued)

FOREIGN PATENT DOCUMENTS

DE          4008272 C1      5/1991

OTHER PUBLICATIONS

Extended European Search Report from corresponding European Application No. 24196081.4 dated May 13, 2025.

*Primary Examiner* — Nathaniel E Wiehe
*Assistant Examiner* — Jackson N Gillenwaters
(74) *Attorney, Agent, or Firm* — Kinney & Lange, P.A.

(57) ABSTRACT

A fan module includes a fan cover, a fixed grid coupled to the fan cover, a fan assembly positioned between the fan cover and the fixed grid, and at least one movable grid coupled to the fixed grid. The at least one movable grid is configured to move between an open position and a closed position. The fan module further includes a knob extending through the fan cover and the fixed grid. The knob is configured to move the at least one movable grid between the open position and the closed position. The knob includes an elongated portion, with the elongated portion being configured to prevent removal of the fan cover when the at least one movable grid is in the open position and permit removal of the fan cover when the at least one movable grid is in the closed position.

26 Claims, 14 Drawing Sheets

(56)            References Cited

U.S. PATENT DOCUMENTS

| | | | | |
|---|---|---|---|---|
| 2002/0015648 A1* | 2/2002 | Kosugi | ................ | F04D 29/602 |
| | | | | 416/247 R |
| 2008/0043432 A1 | 2/2008 | Hung | | |
| 2009/0021910 A1 | 1/2009 | Lai et al. | | |
| 2018/0347592 A1* | 12/2018 | Arenella | .............. | F04D 29/703 |
| 2020/0068742 A1* | 2/2020 | Tsorng | ............. | H05K 7/20736 |
| 2020/0325905 A1* | 10/2020 | Smailes | ............... | F04D 29/703 |

* cited by examiner

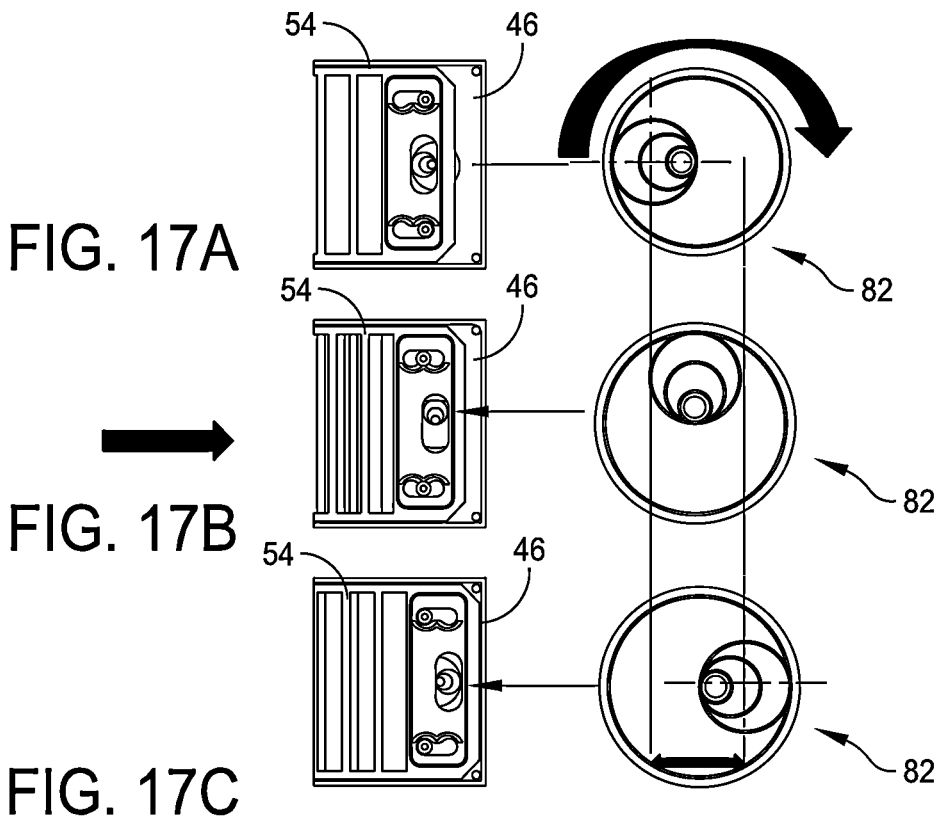
FIG. 17A
FIG. 17B
FIG. 17C
FIG. 18A
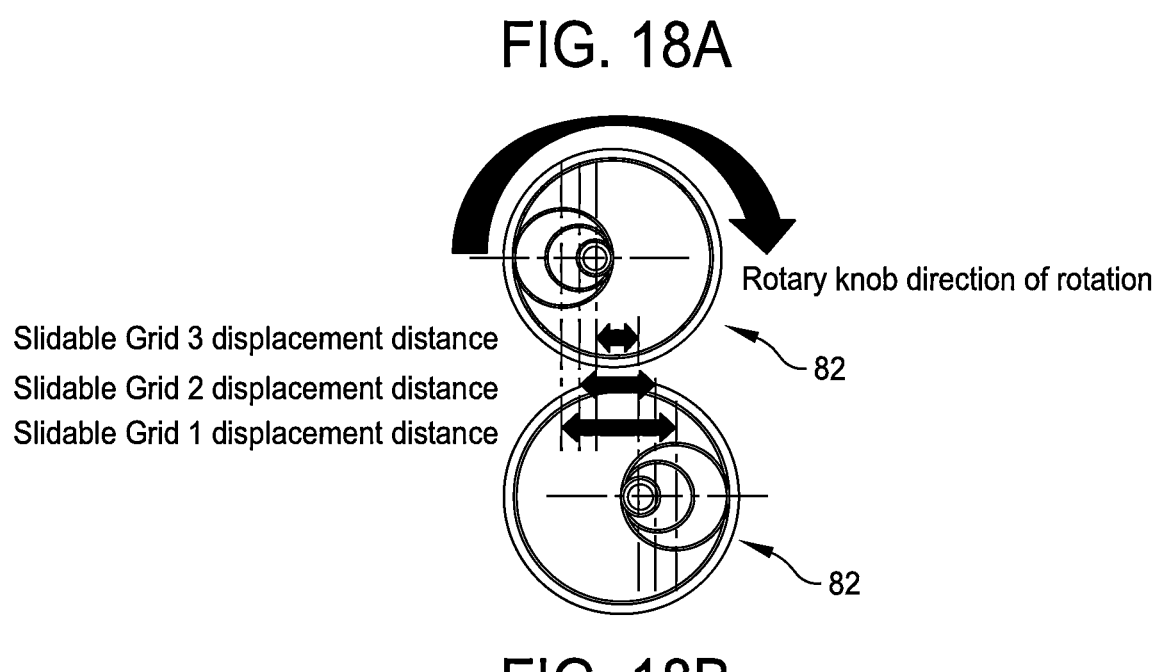
Slidable Grid 3 displacement distance
Slidable Grid 2 displacement distance
Slidable Grid 1 displacement distance
Rotary knob direction of rotation
FIG. 18B

36

46

36

58   56   54

46

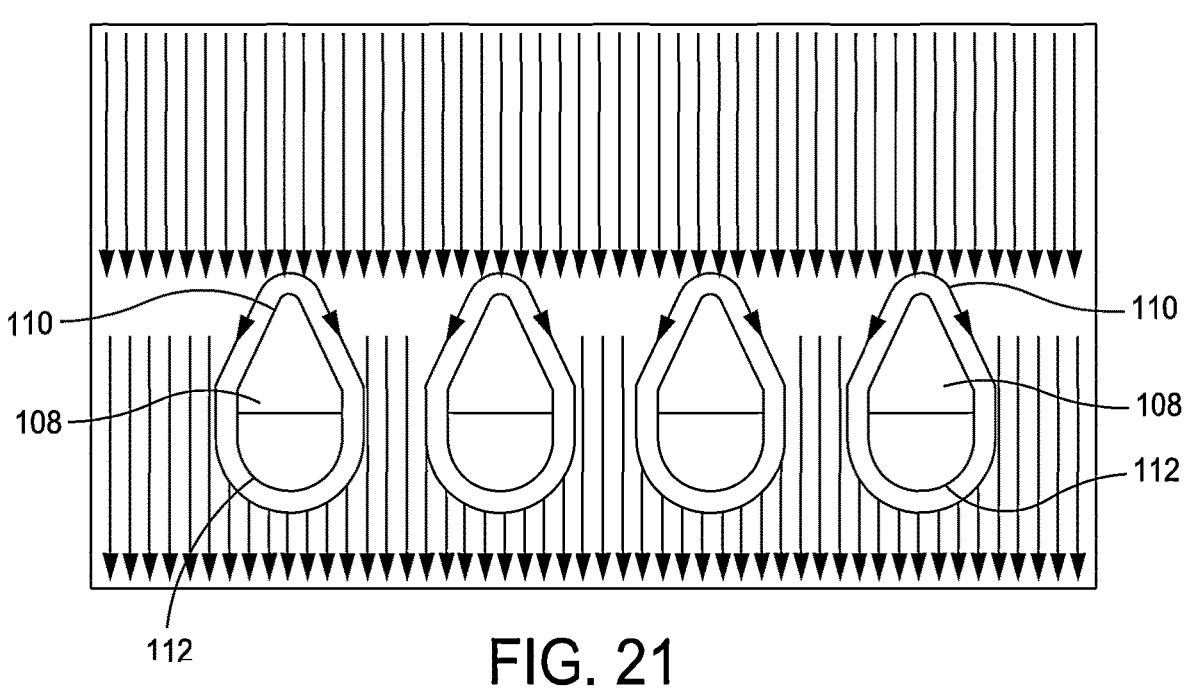
110
108
112
FIG. 21
FIG. 22A
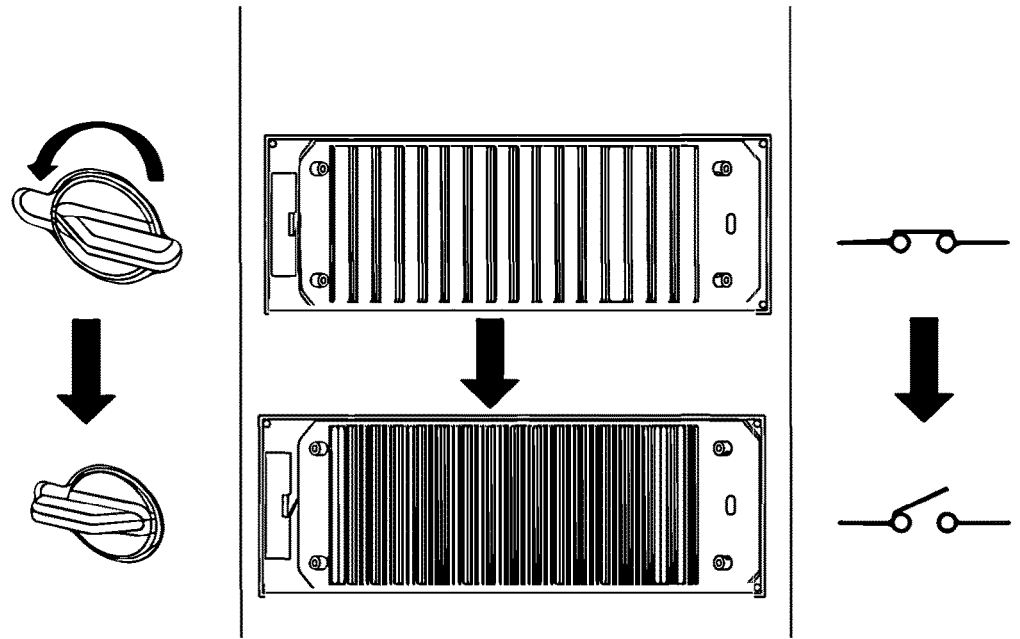
FIG. 22B

VENTILATION AND PROTECTION GRID FOR FAN MODULE

CROSS-REFERENCE TO RELATED APPLICATION

This application claims the benefit under 35 U.S.C. § 119 of Chinese Patent Application No. 202311083007.X, filed Aug. 25, 2023, and titled VENTILATION AND PROTEC-TION GRID FOR FAN MODULE, which is hereby incor-porated herein by reference in its entirety for all purposes.

BACKGROUND OF DISCLOSURE

1. Field of Disclosure

Embodiments of the disclosure relate generally to safety features, and more specifically, to a safety assembly that is used within an equipment rack to mitigate the risk of exposure of person to an arc flash events from connecting and disconnecting fan modules from power modules within the equipment rack.

2. Discussion of Related Art

Centralized data centers for computer, communications and other electronic equipment have been in use for a number of years. More recently, with the increasing use of the Internet, large scale data centers that provide hosting services for Internet Service Providers (ISPs), Application Service Providers (ASPs) and Internet content providers have become increasingly popular. It is often desirable to operate equipment within data centers seven days a week, 24 hours per day, with little or no disruption in service. To prevent any disruption in service, it is common practice in data centers to use uninterruptible power supplies (UPSs) provided in equipment racks to ensure that the equipment within the data centers receives continuous power through-out any black out or brown out periods. Further, it is desirable to service the UPS itself without disruption, as well as its constituent parts.

A typical power distribution unit consists of a rack frame chassis and removable power distribution modules or power modules for short, which are often removed for replacement or service. Often, the equipment rack includes a warning label to power down the equipment rack to avoid hazards, such as arc flash, but such a label oftentimes can be ineffective. Other approaches have been tried, such as installing a blanking panel to block access to dangerous live components in the equipment rack. However, this approach, when implemented, requires additional time and parts. Fan modules are used to cool the electronic equipment housed in the equipment rack.

Often, fan modules are removed and replaced from the equipment rack. Arc flashing can occur during such removal and replacement of such fan modules. It should be noted that when a fan module needs to be repaired or replaced, the power module must be powered off. Fan units are consum-ables that need to be replaced regularly. When removing the fan module, there is a risk of arc flash, which may be dangerous to the person replacing the fan module.

SUMMARY OF DISCLOSURE

One aspect of the present disclosure is directed to a fan module comprising a fan cover including an opening, a fixed grid coupled to the fan cover, a fan assembly positioned between the fan cover and the fixed grid, and at least one movable grid coupled to the fixed grid. The at least one movable grid is configured to move between an open position in which air flows through the fixed grid and the at least one movable grid and a closed position in which air flow is blocked by the fixed grid and the at least one movable grid. The fan module further comprises a knob extending through the fan cover and the fixed grid. The knob is configured to move the at least one movable grid between the open position and the closed position. The knob includes an elongated portion, with the elongated portion being configured to prevent removal of the fan cover when the at least one movable grid is in the open position and permit removal of the fan cover when the at least one movable grid is in the closed position.

Embodiments of the fan module further may include configuring the knob with a cam to engage the at least one movable grid to move the at least one movable grid between the open position and the closed position when rotating the knob. The at least one movable grid may include at least two movable grids, with each movable grid being configured to be engaged by a portion of the cam. Each movable grid of the at least two movable grids may include an opening that functions as a cam follower when engaged by the portion of the cam to move the movable grid. The fan module further may include a switch located proximate to the at least one movable grid. The at least one movable grid may be con-figured to release the switch when moved to the closed position. The switch, when released by the at least one movable grid, may be configured to deenergize a power module on which the fan module is secured. The switch may be a microswitch. The at least one movable grid may include a plurality of grid members, with each grid member having a front sharp corner and a back round surface.

Another aspect of the present disclosure is directed to a fan module comprising a fan cover including an opening, a fixed grid coupled to the fan cover, a fan assembly posi-tioned between the fan cover and the fixed grid, and at least one movable grid coupled to the fixed grid. The at least one movable grid is configured to move between an open position in which air flows through the fixed grid and the at least one movable grid and a closed position in which air flow is blocked by the fixed grid and the at least one movable grid. The fan module further comprises a switch. The at least one movable grid is configured to release the switch when moved to the closed position. The switch, when released by the at least one movable grid, is configured to deenergize a power module on which the fan module is secured.

Embodiments of the fan module further may include a knob extending through the fan cover and the fixed grid. The knob is configured to move the at least one movable grid between the open position and the closed position. The knob may include an elongated portion, with the elongated por-tion being configured to prevent removal of the fan cover when the at least one movable grid is in the open position and permit removal of the fan cover when the at least one movable grid is in the closed position. The knob may include a cam configured to engage the at least one movable grid to move the at least one movable grid between the open position and the closed position when rotating the knob. The at least one movable grid may include two movable grids, with each movable grid being configured to be engaged by a portion of the cam. Each movable grid of the two movable grids may include an opening that functions as a cam follower when engaged by the portion of the cam to move the movable grid. The at least one movable grid may include a plurality of grid members, each grid member having a front sharp corner and a back round surface. The switch may be a microswitch.

Yet another aspect of the present disclosure is directed to a method of replacing a fan assembly of a fan module of the type having a fan cover, a fixed grid coupled to the fan cover, a fan assembly positioned between the fan cover and the fixed grid, and at least one movable grid configured to move between an open position in which air flows through the fixed grid and the at least one movable grid and a closed position in which air flow is blocked by the fixed grid and the at least one movable grid. In one embodiment, the method comprises moving the at least one movable grid from the open position to the closed position and releasing a switch with the at least one movable grid. The at least one movable grid is configured to release the switch when moved to the closed position. The switch, when released by the at least one movable grid, is configured to deenergize a power module on which the fan module is secured. The method further comprises removing the front cover to access the fan assembly for replacement.

Embodiments of the method further may include, after replacing the fan assembly, installing the fan cover and moving the at least one movable grid from the closed position to the open position. Moving the at least one movable grid may include rotating a knob that extends through the fan cover and the fixed grid, with the knob being configured to move the at least one movable grid between the open position and the closed position. The knob may include an elongated portion, with the elongated portion being configured to prevent removal of the fan cover when the at least one movable grid is in the open position and permit removal of the fan cover when the at least one movable grid is in the closed position. The knob may include a cam configured to engage the at least one movable grid to move the at least one movable grid between the open position and the closed position when rotating the knob. The at least one movable grid may include at least two movable grids, with each movable grid being configured to be engaged by a portion of the cam. Each movable grid of the at least two movable grids may include an opening that functions as a cam follower when engaged by the portion of the cam to move the movable grid. The at least one movable grid may include a plurality of grid members, each grid member having a front sharp corner and a back round surface. The switch may be a microswitch.

BRIEF DESCRIPTION OF DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the disclosure. In the figures, identical or nearly identical components illustrated in various figures may be represented by like numerals. For purposes of clarity, not every component may be labeled in every figure. In the drawings:

FIGS. 17A-17C are front views of a portion of the grid assembly showing the rotary knob in different positions;

FIGS. 18A and 18B are front views showing the rotary knob in different positions causing displacement of grids of the grid assembly;

FIG. 21 is a cross sectional view of a portion of grids of the grid assembly showing flow of air through the grids;

FIG. 22A are views of the rotary knob, the grids and the microswitch, with the rotary knob in the locked position, the grids open, and the microswitch in the closed position; and FIG. 22B are views of the rotary knob, the grids and the microswitch, with the rotary knob in the unlocked position, the grids closed, and the microswitch in the open position.

DETAILED DESCRIPTION

Figure 1:
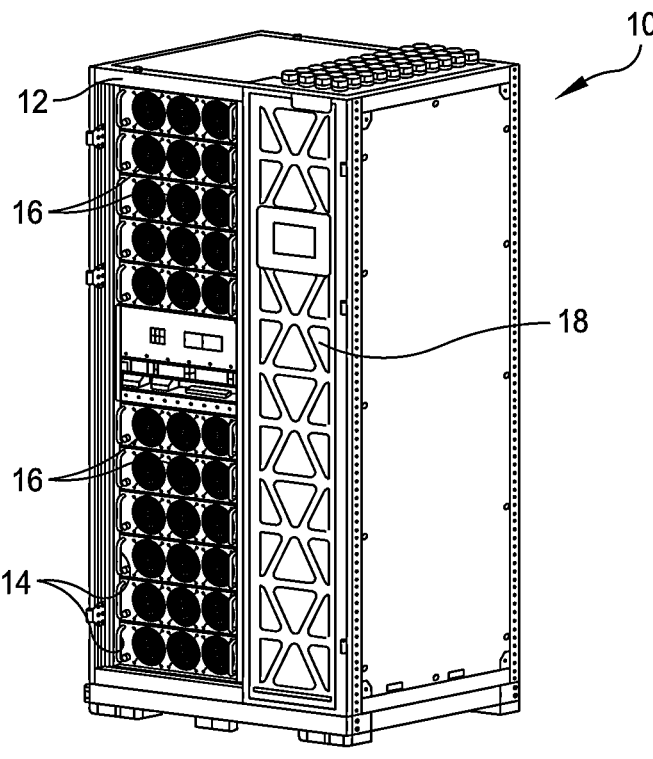
FIG. 1 is a back perspective view of an equipment rack.

This disclosure is not limited in its application to the details of construction and the arrangement of components set forth in the following description or illustrated in the drawings. The principles set forth in this disclosure are capable of being provided in other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

During the replacement of a fan module of a power module, arc flash can occur. Specifically, energized-swapping activities can pose electrical hazards, such as shock and arc flash, to operators performing such replacements. A shock hazard may occur when the operator approaches energized electric conductors or circuit parts. The operator may inadvertently touch a live part of the power module, i.e., due to disturbances, stumbling, or when in close proximity to de-energized parts. An arc flash may result when a fault occurs between two live conductors. Sources of an arc flash can be foreign elements, such as tools or dust/debris, defect or worn-down insulation material, poor design, poor installation, to name a few. Arc flash can be measured based on incident energy released through the air in the form of heat, sound, light, and explosive pressure, all of which can cause harm. Some specific injuries can include burns, blindness, electric shock, hearing loss, and fractures.

The present disclosure is directed to a ventilation and protection grid assembly for a fan module used within a power module. The grid assembly is designed to enable the operator to safely remove and install a new fan module.

Referring to the drawings, and more particularly to FIG. 1, an equipment rack is generally indicated at 10. In one embodiment, the equipment rack 10 includes a chassis 12, or frame structure that defines an enclosure. The equipment rack 10 includes an open side which may or may not have a door to enclose the equipment rack. The open side has several mounting slots, each indicated at 14, that are each configured to slidably receive electronic components, such as power modules, each indicated at 16. Once installed, the power modules, each indicated at 16, may be configured to engage a busbar provided at a back of the chassis 14 in the well-known manner to provide power to the power modules. In another embodiment, the power modules 16 may be configured to be powered by a power distribution unit (PDU) located within the equipment rack 10 to provide power to the power modules.

Figure 2:
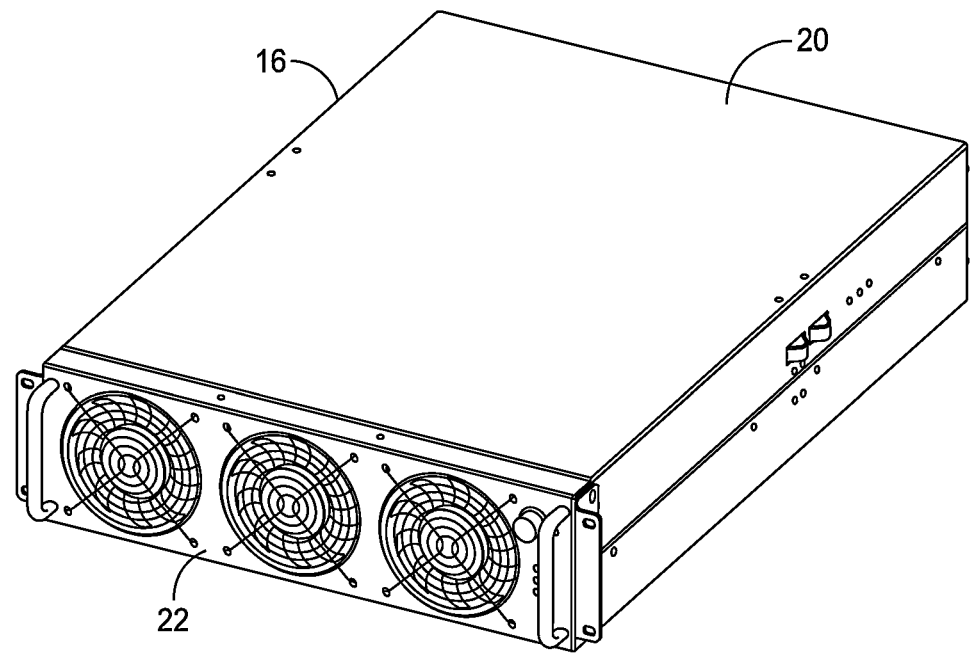
FIG. 2 is a perspective view of a power module having a fan module to provide cooling to the power module.

As shown, the open side the equipment rack 10 includes a panel 18 and several power modules 16 positioned within the equipment rack. In the shown embodiment, the power modules 16 are mounted horizontally within the equipment rack 10 within their respective mounting slots 14. The equipment rack 10 can be configured to mount any number of power modules 16 at desired locations and orientations within the equipment rack 10. Referring to FIG. 2, each power module 16 includes housing 20 configured to be supported within the mounting slot 14 of the equipment rack 10. In one embodiment, the housing 20 of the power module is rectangular- or square-shaped in construction, and sized to fit within the mounting slot 14 of the equipment rack 10. The size and shape of the housing 20 of the power module 16 can be configured based on the size and shape of the mounting slots 14 of the equipment rack 10.

Each power module 16 further includes a fan module 22 provided at a back of the housing 20 of the power module. As will be described in greater detail below, the fan module 22 includes several fan units and a grid assembly that prevents the fan module to be removed from the housing 20 of the power module 16 without powering down the power module and closing vents of the grid assembly.

Figure 3:
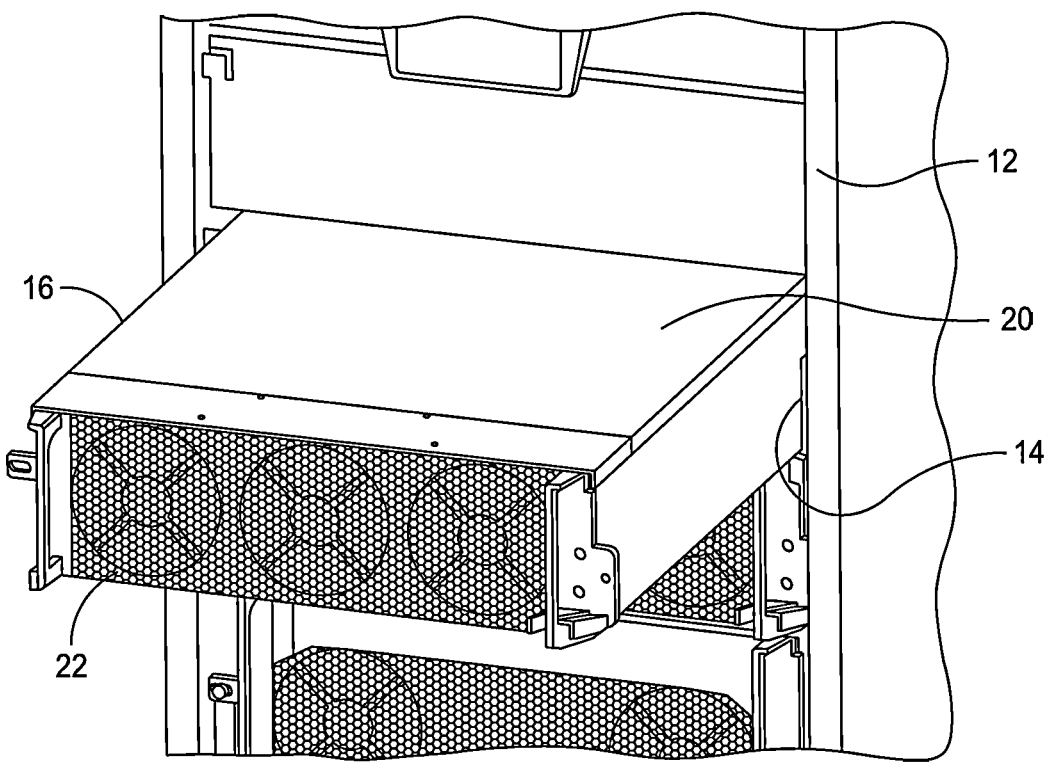
FIG. 3 is a perspective view of the power module being removed from the equipment rack.

Referring to FIG. 3, the power module 16 is shown to be partially removed from its respective mounting slot 14 of the equipment rack 10. In this position, the fan module 22 can be removed to replace a broken or defective fan unit within the fan module. As shown, the fan module 22 includes three fan units to provide cooling to the electronic components of the power module 16. The fan module 22 can be configured with any number of fan units to provide cooling to the power module 16.

Figure 4:
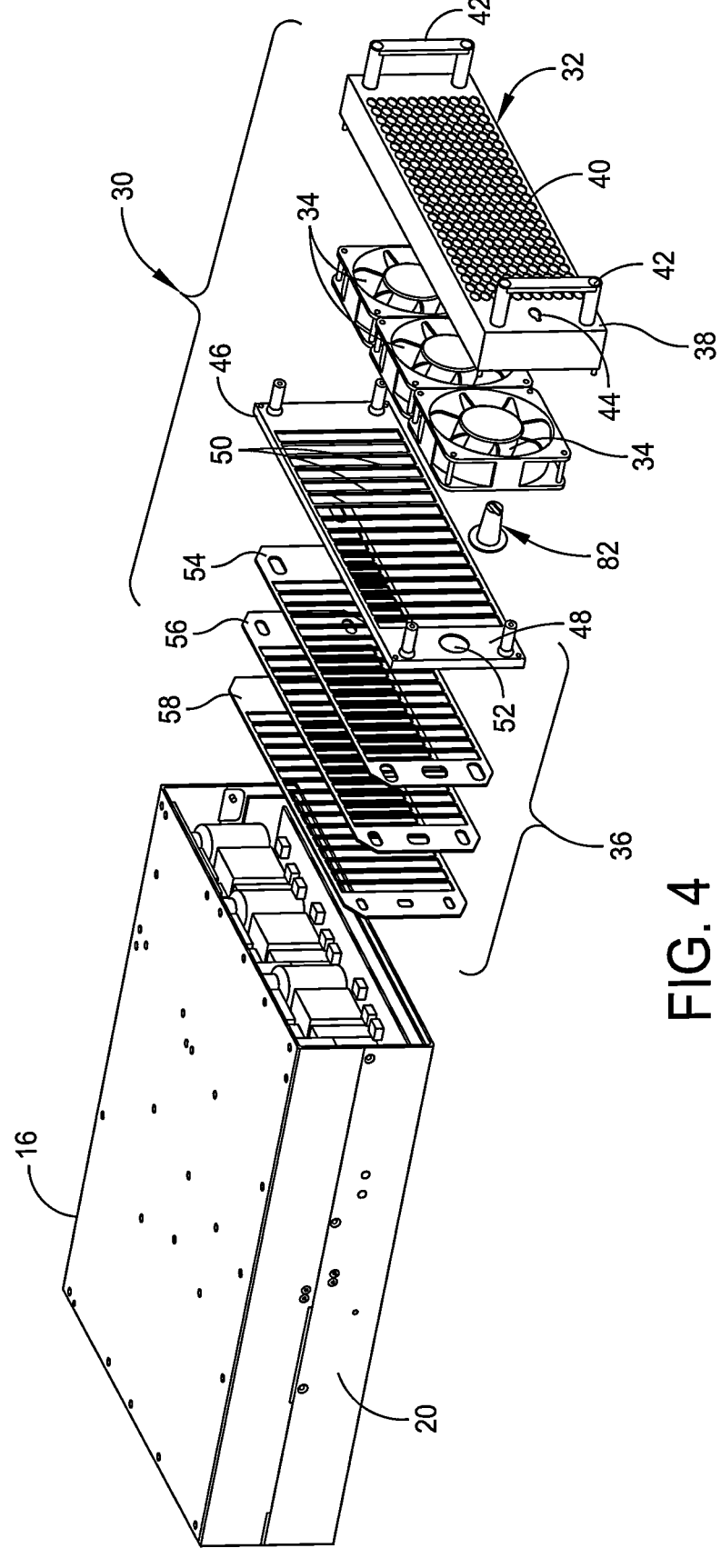
FIG. 4 is an exploded front perspective view of a grid assembly configured to support the fan module on the power module.
Figure 5:
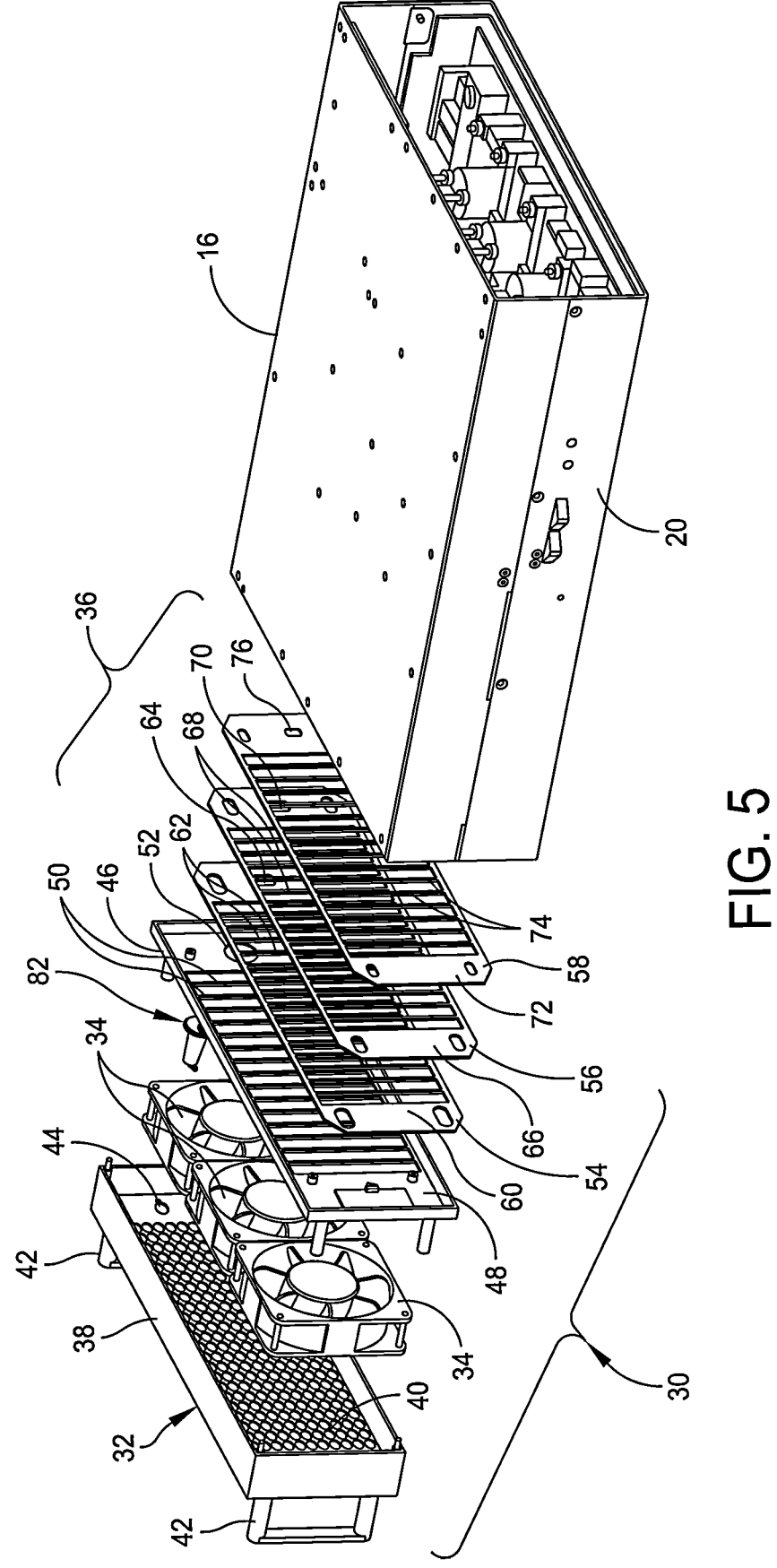
FIG. 5 is an exploded back perspective view of the grid assembly.

Referring to FIGS. 4 and 5, the components of the fan module assembly of an embodiment of the present disclosure is generally indicated at 30. As shown, the fan module 30 assembly includes a front cover, generally indicated at 32, several, e.g., three, fan units, each indicated at 34, and a grid assembly, generally indicated at 36. The front cover 32 includes an elongated body 38 having a central opening formed 40 therein. In the shown embodiment, the central opening 40 includes a plurality of smaller openings or perforations, e.g., a mesh, to enable air to pass through the front cover 32. The front cover 32 further includes a pair of handles, each indicated at 42, extending from the elongated body 38 to enable an operator to install and remove the fan module 30 from the power module 16. The elongated body 38 of the front cover 32 further includes a smaller circular opening 44 located adjacent to the central opening 40, the purpose of which will be described in greater detail below.

Each fan unit 34 includes a fan unit housing, a fan motor supported by the fan unit housing and a fan blade coupled to the fan motor. In the shown embodiment, three fan units 34 are provided; however, the fan module 30 can be configured to support any number of fan units 34. The front cover 32 is designed to enclose the fan units 34 while enabling the fan units to draw air through the central opening 40 of the front cover to move air over the electronic components provided in the housing 20 of the power module 16. In one embodiment, the fan units 34 are connected to the power module 16 by a fan cable or by a suitable connector.

Still referring to FIGS. 4 and 5, the grid assembly 36 includes a fixed grid 46, which is designed to support the front cover 32 when assembled, with the fan units 34 being disposed between the fixed grid and the front cover. The manner in which the front cover 32 is secured to the fixed grid 46 will be described in greater detail below. The fixed grid 46 includes an elongated body 48 shaped similar to the elongated body 38 of the front cover 32. As shown, the elongated body 48 of the fixed grid 46 includes a plurality of vertical slots, each indicated at 50, which are each separated by grids and arranged along a length of the elongated body. These slots 50 enable air to pass through the elongated body 48 of the fixed grid 46. The fixed grid 46 further includes a smaller circular opening 52 located adjacent to the plurality of slots 50. When the front cover 32 is secured to the fixed grid 46, the circular opening 44 of the front cover is aligned with the circular opening 52 of the fixed grid. As shown, the circular opening 52 of the fixed grid 46 is larger than the circular opening 44 of the front cover 32.

The grid assembly 36 further includes one or more additional grids. In the shown embodiment, the grid assembly 36 further includes a first slidable grid 54, a second slidable grid 56, and a third slidable grid 58. Each slidable grid 54, 56, 58 is configured to be assembled with the front cover 32, the fan units 34 and the fixed grid 46 to achieve the complete fan module. It should be noted that the front cover 32 and the fan units 34 together may be referred to as a "fan module subassembly," which is configured to be secured to the housing 20 of the power module 16, with the grid assembly 36 disposed in between.

The first slidable grid 54 includes an elongated body 60 that is shaped similar to the elongated body 48 of the fixed grid 46. The elongated body 60 of the first slidable grid 54 includes a plurality of vertical slots, each indicated at 62, which are arranged along a length of the elongated body. The vertical slots 62 of the first slidable grid 54 are configured to align with the vertical slots 50 of the fixed grid 46 when in the open position. The first slidable grid 54 further includes a smaller vertical slot 64 located adjacent to the plurality of slots 62. As with the front cover 32, when the first slidable grid 54 is assembled, the vertical slot 64 of the first slidable grid is aligned with the circular opening 52 of the fixed grid 46 and the circular opening 52 of the front cover 32, respectively.

Similarly, the second slidable grid 56 includes an elongated body 66 that is shaped similar to the elongated bodies 48, 60 of the fixed grid 46 and the first slidable grid 54, respectively. The elongated body 66 of the second slidable grid 56 includes a plurality of vertical slots, each indicated at 68, which are arranged along a length of the elongated body. The vertical slots 68 are configured to align with the vertical slots 50, 62 of the fixed grid 46 and the first slidable grid 54 when in the open position. The second slidable grid 56 further includes a smaller vertical slot 70 located adjacent to the plurality of slots 68. As with the front cover 32 and the first slidable grid 54, when the second slidable grid 56 is assembled, the smaller vertical slot 70 of the second slidable grid is aligned with the vertical slot 64 of the first slidable grid 54 and the circular opening 52 of the fixed grid 46 and the circular opening 44 of the front cover, respectively.

Likewise, the third slidable grid 58 includes an elongated body 72 that is shaped similar to the elongated bodies 48, 60, 66 of the fixed grid 46, the first slidable grid 54, and the second slidable grid 56, respectively. The elongated body 72 of the third slidable grid 58 includes a plurality of vertical slots, each indicated at 74, arranged along a length of the elongated body. The vertical slots 74 are configured to align with the vertical slots 50, 62, 68 of the fixed grid 46, the first slidable grid 54, and the second slidable grid 56 when in the open position. The third slidable grid 58 further includes an even smaller vertical slot 76 located adjacent to the plurality of slots 74. As with the front cover 32, the first slidable grid 54, and the second slidable grid 56, when the third slidable grid 58 is assembled, the even smaller vertical slot 76 of the third slidable grid is aligned with the vertical slots 64, 70 of the first slidable grid and the second slidable grid and the circular openings 44, 52 of the front cover 32 and the fixed grid 46, respectively.

The first slidable grid 54, the second slidable grid 56, and the third slidable grid 58 are coupled to the power module 16 and can be manipulated as described below to achieve a fully open position and a fully closed position. In another embodiment, the first slidable grid 54, the second slidable grid 56, and the third slidable grid 58 can be configured to achieve any position between the open position and the closed position. The amount of airflow through the fan module 30 will be described in greater detail below. The fan module 30 is configured to prevent removal of the fan module to replace one or more fan units 34 when the slidable grids 54, 56, 58 of the grid assembly 36 are in an open position. Only upon moving the slidable grids 54, 56, 58 of the grid assembly 36 to the fully closed position can the fan module subassembly, i.e., the front cover 32 and the fan units 34 be removed from the power module 16 by an operator. Specifically, the operator can use the handles 42 provided on the front cover 32 to remove the front cover and the fan units 34 of the fan module 30.

Figures 6A, 6B:
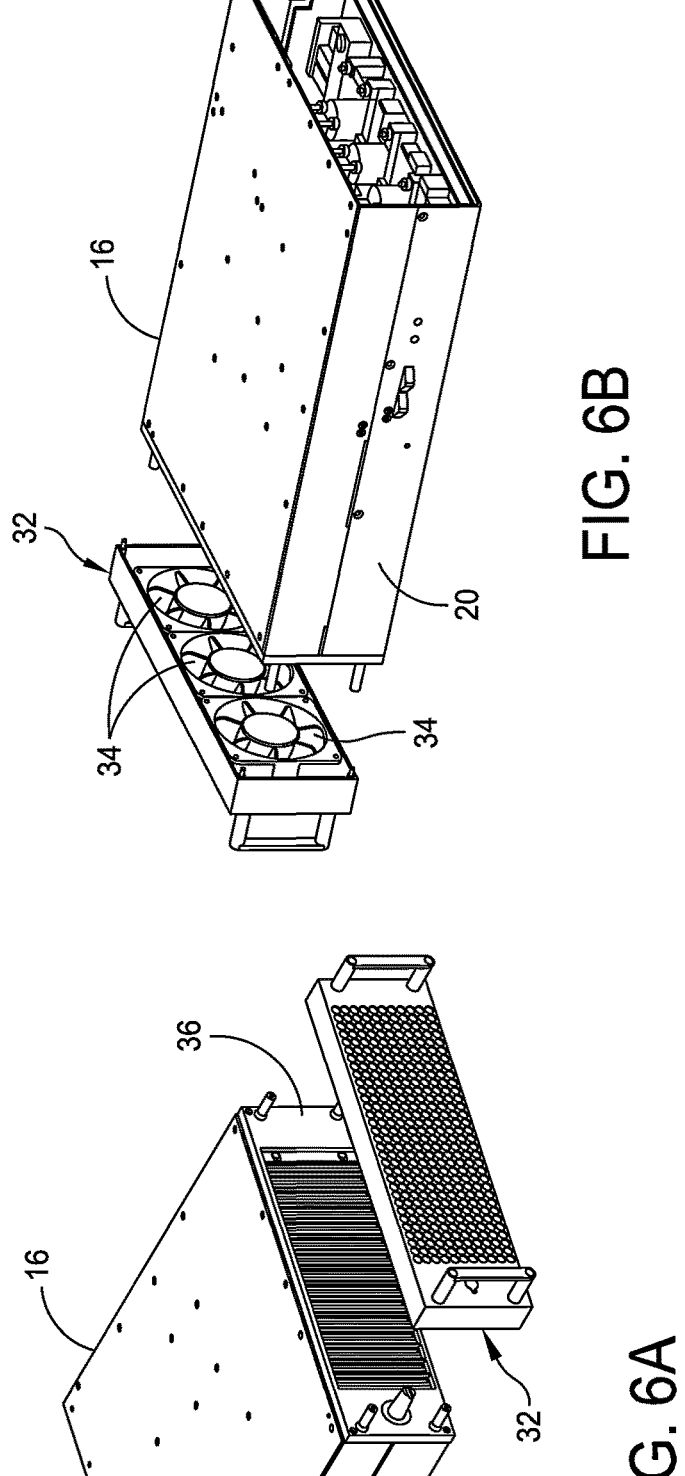
FIG. 6A is a front perspective view of the grid assembly and the fan module prior to being installed on the power module.
FIG. 6B is a back perspective view of the grid assembly shown in FIG. 6A.

FIGS. 6A and 6B show the front cover 32 and the fan units 34 of the fan module 30 removed from the housing 20 of the power module 16. As shown, the grid assembly 36 of the fan module 30 remains secured to the housing 20 of the power module 16 and the fan module subassembly, i.e., the front cover 32 and the fan units 34, is removed as a coupled unit from the grid assembly and the power module. In this position, the fan units 34 can be replaced or repaired as desired.

Figures 7A, 7B:
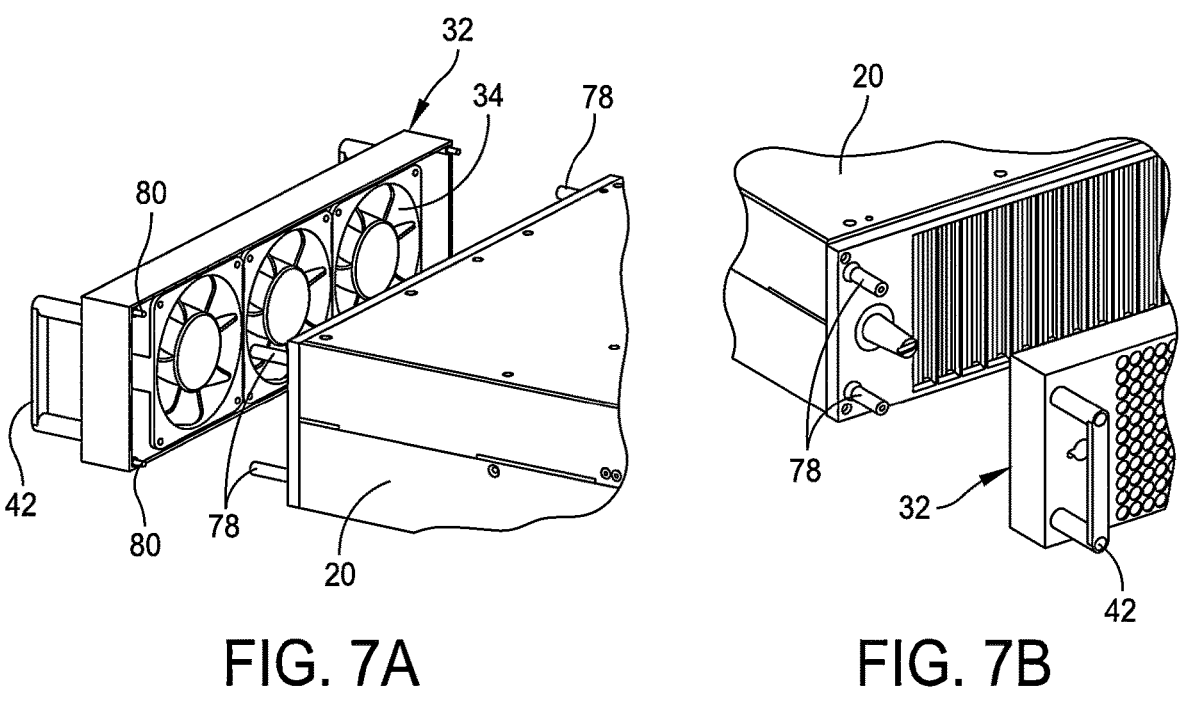
FIGS. 7A and 7B are enlarged perspective views of aspects of the grid assembly.
Figure 8:
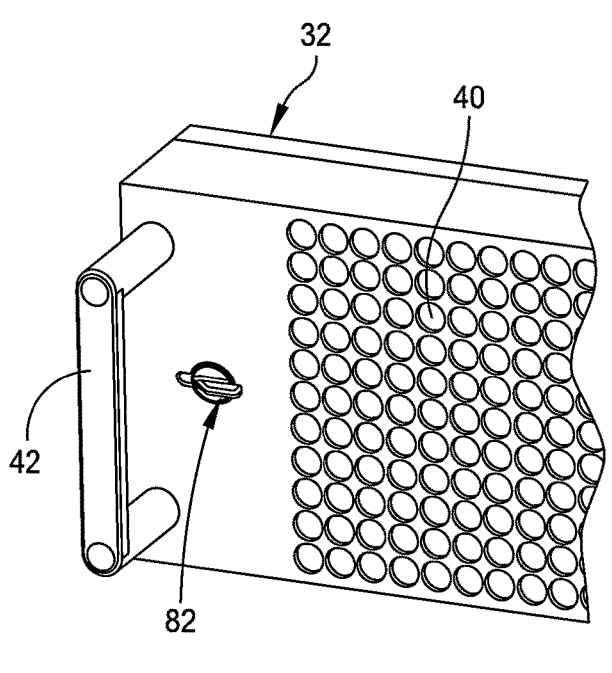
FIG. 8 is an enlarged perspective of a portion of the grid assembly.

Referring to FIGS. 7A, 7B and 8, the power module 16 includes fixed pins, each indicated at 78, that extend perpendicularly from the back of the housing 20 of the power module. These fixed pins 78 are provided at the four corners of the housing 20 of the power module, and are received within guide openings, each indicated at 80, formed in the front cover 32 of the fan module 30. The fixed pins 78 extend through slots provided at the four corners of the first slidable grid 54, the second slidable grid 56, and the third slidable grid 58. The slots in the slidable grids enable the slidable grids 54, 56, 58 to move laterally with respect to the pins 78 to enable the movement of the slidable grids between the fully open position and the fully closed position. As will be described in greater detail below, the front cover 32 is configured to be releasably secured to the power module 16 to prevent the unwanted removal of the front cover 32 and the fan units 34.

Figure 9A:
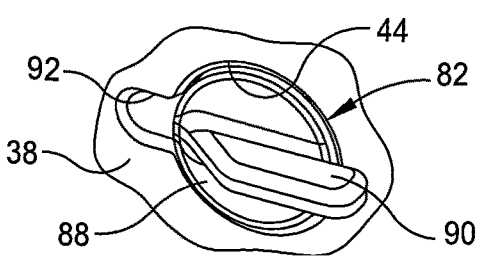
FIG. 9A is a front view of a rotary knob of the grid assembly in a locked position.
Figure 9B:
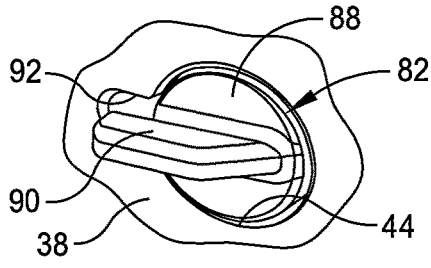
FIG. 9B is a front view of the rotary knob of the grid assembly in an unlocked position.

Referring to FIGS. 9A and 9B, the fan module further includes a knob, generally indicated at 82, which extends through the slidable grids 54, 56, 58 of the grid assembly 36 and the front cover 32. With additional reference to FIGS. 14A and 14B, the knob 82 includes a base portion 84 that is positioned next to a back surface of the third slidable grid 58, a stem portion 86 that extends through the third slidable grid, the second slidable grid 56, the first slidable grid 54, the fixed grid 46 and the front cover 32, and a head portion 88 that is positioned next to a front surface of the front cover 32. Specifically, the stem portion 86 of the knob 82 extends through the vertical slots 64, 70, 76 of the first, second, and third slidable grids 54, 56, 58, respectively and the circular openings 44, 52 of the front cover 32 and the fixed grid 46. The knob 82 is configured to move the slidable grids 54, 56, 58 of the grid assembly 36 between the open position and the closed position. The head portion 88 of the knob 82 includes an elongated portion 90, which prevents removal of the front cover 32 and fan units 34 when the slidable grids 54, 56, 58 are in the open position and permits removal of the front cover and fan units when the slidable grids are in the closed position.

FIG. 9A shows the knob 82 rotated in locked position in which the fan module subassembly, i.e., the front cover 32 and the fan units 34, cannot be removed from the power module 16. Specifically, the elongated portion 90 of the head portion 88 of the knob 82 engages a front surface of the elongated body 38 of the front cover 32. FIG. 9B shows the knob 82 rotated one hundred and eighty degrees so that the elongated portion 90 of the head portion 88 is aligned with a slot 92 formed in the elongated body 38 of the front cover 32, the slot being formed from the circular opening 44 of the front cover. In this position, the front cover 32 is not captured in place by the knob 82 and can be removed from the power module 16 by pulling on the handles 42 of the front cover 32.

Figure 10A:
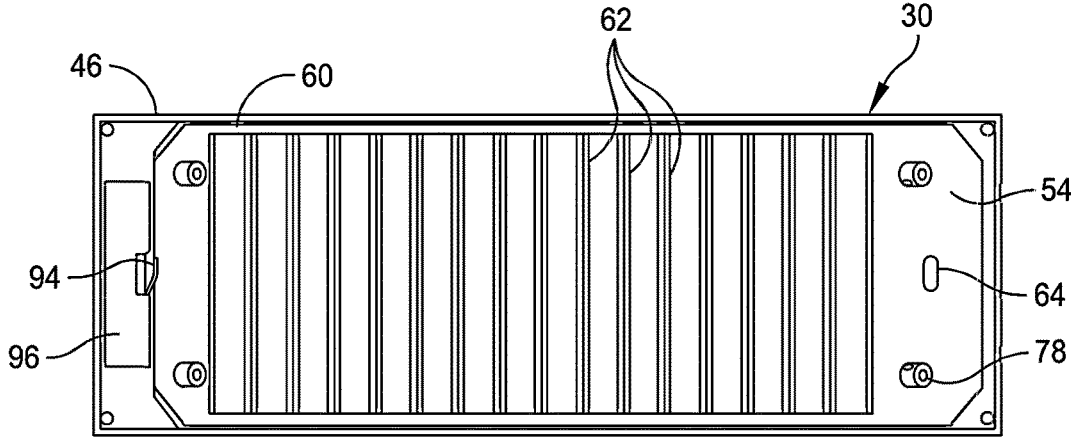
FIG. 10A is a front view of the grid assembly showing the grid assembly in an open position, with a microswitch being engaged by the grid assembly.
Figure 10B:
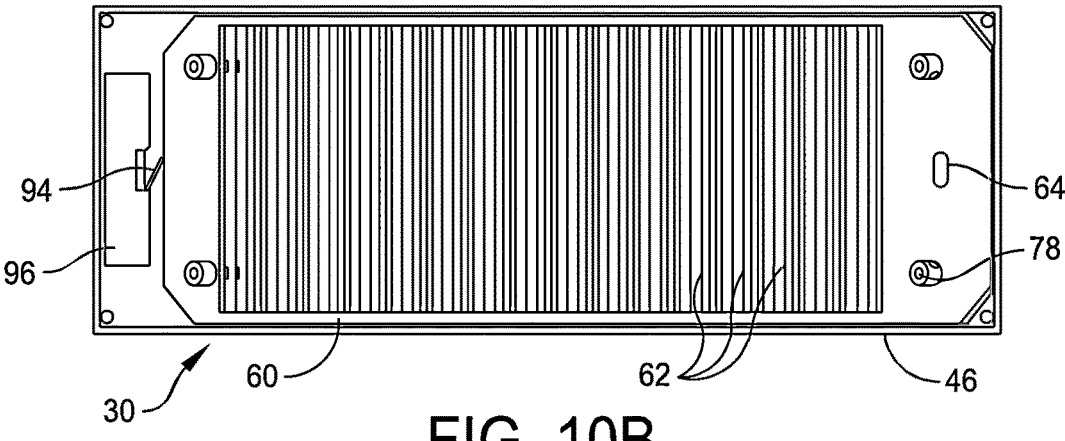
FIG. 10B is a front view of the grid assembly showing the grid assembly in a closed position, with the microswitch being released by the grid assembly.

Referring to FIGS. 10A and 10B, the fan module 30 further includes a switch 94, which is positioned on the back surface of the elongated body 48 of the fixed grid 46 and configured to be engaged by the first slidable grid 54. As shown, the switch 94, which can include a microswitch, is located proximate to first slidable grid 54. The switch 94 is mounted on a printed circuit board (PCB) 96, which is electronically connected or otherwise coupled to the power module 16. FIG. 10A shows the first slidable grid 54 engaging the switch 94 thereby providing a signal to the power module 16 to maintain power between the power module and the fan module 30, and the power module in general. In this position, the fan module subassembly cannot be removed from the power module 16. FIG. 10B shows the first slidable grid 54 moved away from the switch 94 to release the switch thereby terminating the signal from the power module 16 to terminate power to the fan module 30, and the power module in general. In this position, the fan module subassembly can be removed from the power module 16. The lateral movement of the first slidable grid 54 is limited by the engagement of the fixed pins 78 with the edges of their respective slots through which the pins travel.

Figure 11:
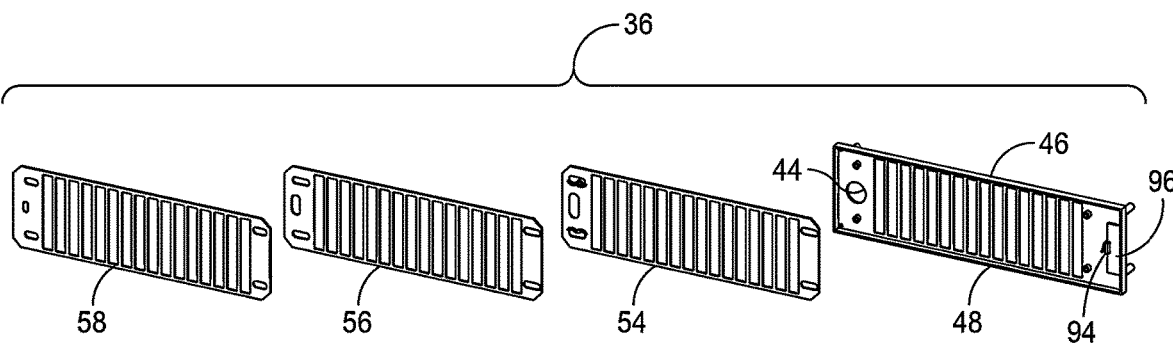
FIG. 11 is a perspective view showing grids of the grid assembly.

Referring to FIG. 11, the components of the grid assembly 36 are shown. The switch 94 and the PCB 96 are mounted on the back surface of the elongated body 48 of the fixed grid 46, on an opposite side of the circular opening 44. The first slidable grid 54, the second slidable grid 56, and the third slidable grid 58 are stacked on one another, with the first slidable grid being configured to engage the switch 94. The three slidable grids 54, 56, 58 can be moved horizontally to achieve the fully open position and the fully closed position in conjunction with the fixed grid 46. In the fully open position, the slidable grids 54, 56, 58 with the front cover 32 and the fixed grid 46, 75% of the ventilation area is achieved.

Figure 12:
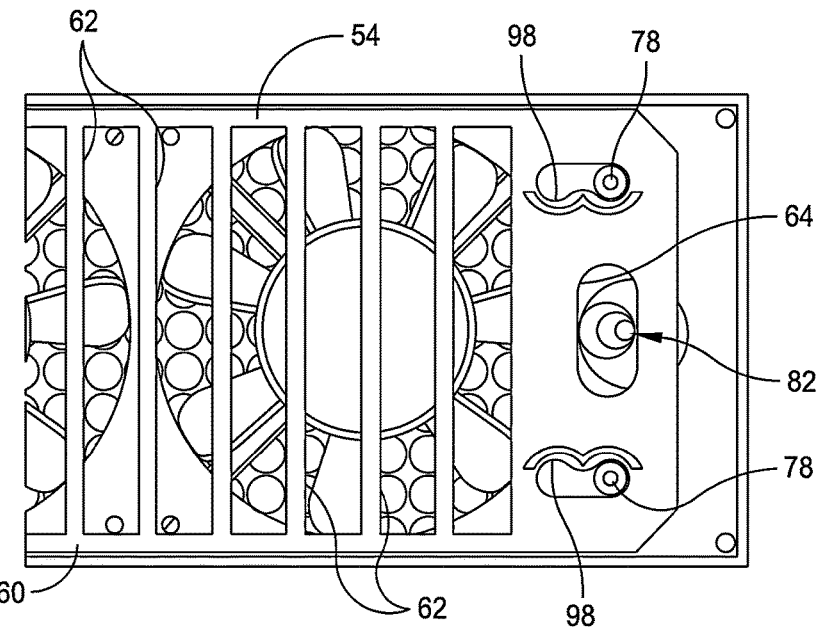
FIG. 12 is a front view of an aspect of the grid assembly.
Figure 13:
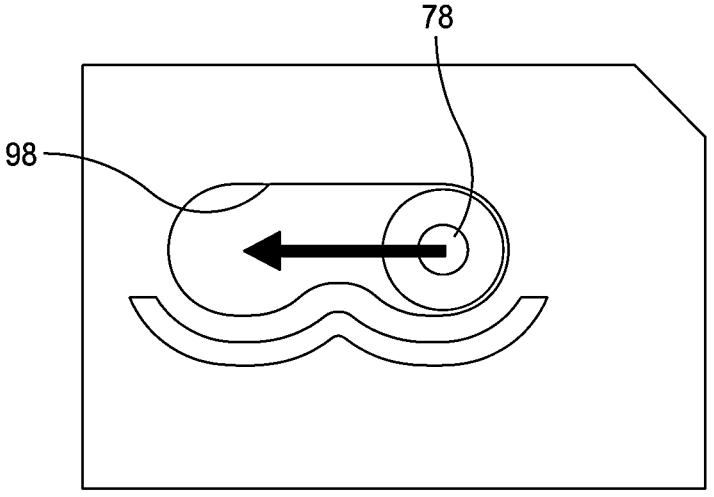
FIG. 13 is an enlarged front view of another aspect of the grid assembly.

Referring to FIGS. 12 and 13, one of the slidable grids, e.g., the first slidable grid 54, can be configured to include a spring feature 98 to ensure that the slidable grids 54, 56, 58 do not maintain a half-closed state. The spring feature 98 is formed in the first slidable grid 54 and engages the fixed pin 78 of the power module 16. The spring feature 98 can be replaced by a metal spring that is affixed to the first slidable grid 54 and/or the fixed grid 46, for example. As mentioned, the spring feature 98 ensures that the slidable grids 54, 56, 58 are not caught in a middle position, with the fixed pin 78 being biased to move to the open or closed position by the spring feature.

Figures 14A, 14B:
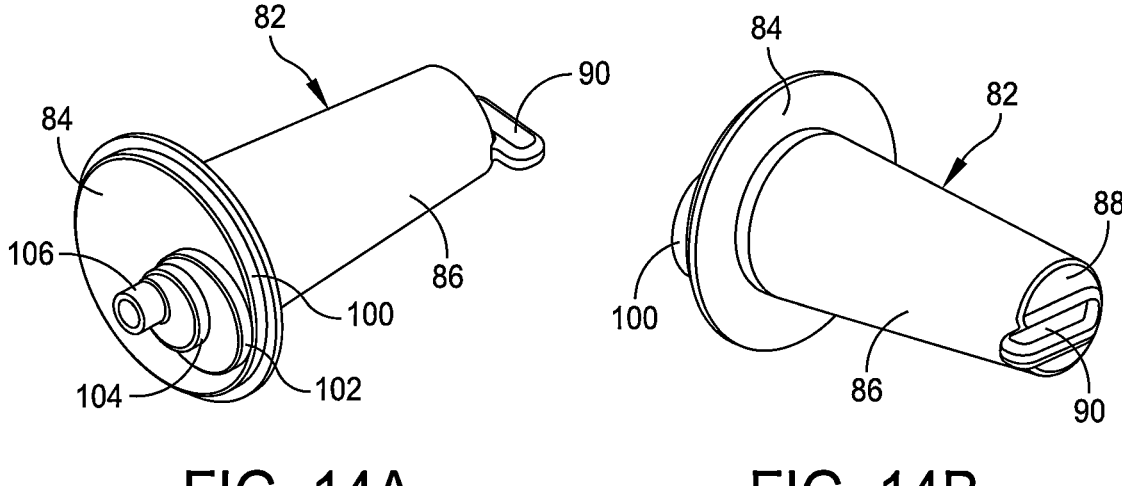
FIGS. 14A and 14B are perspective views of the rotary knob.
Figure 15:
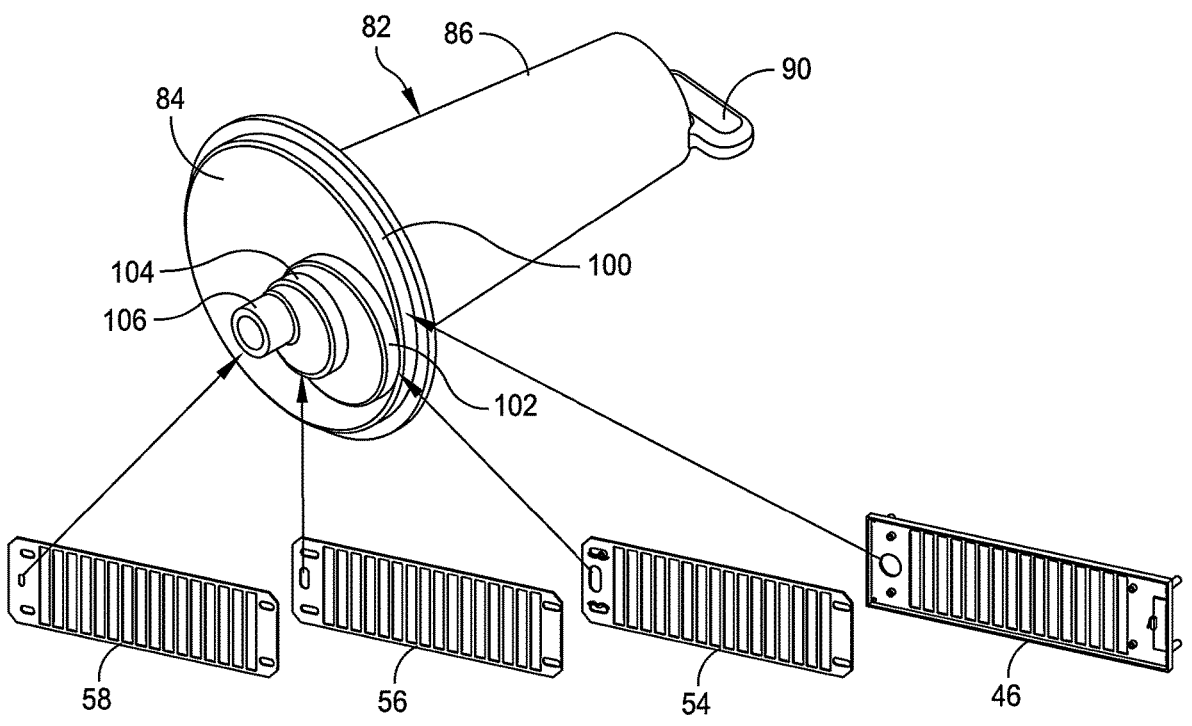
FIG. 15 is a perspective view of the grid assembly showing cylinders of the rotary knob and their respective grids.

Referring to FIGS. 14A and 14B, the base portion 84 of the knob 82 includes a cam feature that includes four cam cylinders to extend through the circular opening 52 of the fixed grid 46 and to engage the vertical slots 62, 68, 74 of the first, second, and third slidable grids 54, 56, 58, respectively. With additional reference to FIG. 15, when assembled, a first cam cylinder 100 is positioned to extend through the circular opening 52 of the fixed grid 46. Further, a second cam cylinder 102 is positioned to engage an edge of the vertical slot 64 of the first slidable grid 54 to move the first slidable grid, a third cam cylinder 104 is positioned to engage an edge of the vertical slot 70 of the second slidable grid 56 to move the second slidable grid, and a fourth cam cylinder 106 is positioned to engage an edge of the vertical slot 76 of the third slidable grid 58 to move the third slidable grid. The cam feature of the rotary knob 82 provides varying distances of movement of the slidable grids 54, 56, 58 to facilitate the opening and the closing of the slidable grids. The edges of the vertical slots 64, 70, 76 function as cam followers when rotating the knob 82 to move the slidable grids in the manner described below.

Figure 16:
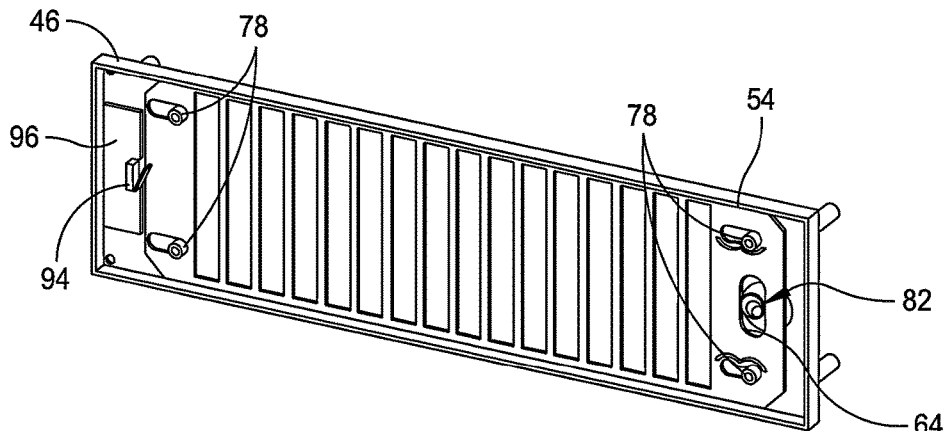
FIG. 16 is a perspective of a fixed grid of the grid assembly.

Referring to FIG. 16, the first slidable grid 54 moves left and right when the knob 82 is rotated. The second cam cylinder 100 engages the edge of the vertical slot 64 to move the first slidable grid 54. FIGS. 17A-17C show the movement of the first slidable grid 54 when rotating the knob 82 in a clockwise direction. As shown, prior to turning the knob 82 (the knob being represented at a 9:00 position in FIG. 17A), the slidable grid is positioned to the left. Upon rotating the knob 90 degrees (the knob 82 being represented at a 12:00 position in FIG. 17B), the first slidable grid 54 is moved part way to the right. And upon rotating the knob 180 degrees (the knob 82 being represented at a 3:00 position in FIG. 17C), the first slidable grid 54 is moved to the right. FIGS. 18A and 18B show the movement of the first slidable grid 54, the second slidable grid 56, and the third slidable grid 58, each having a different motion distance from one another. The three slidable grids 54, 56, 58 are configured to achieve the fully open position and the full closed position.

Figure 19A:
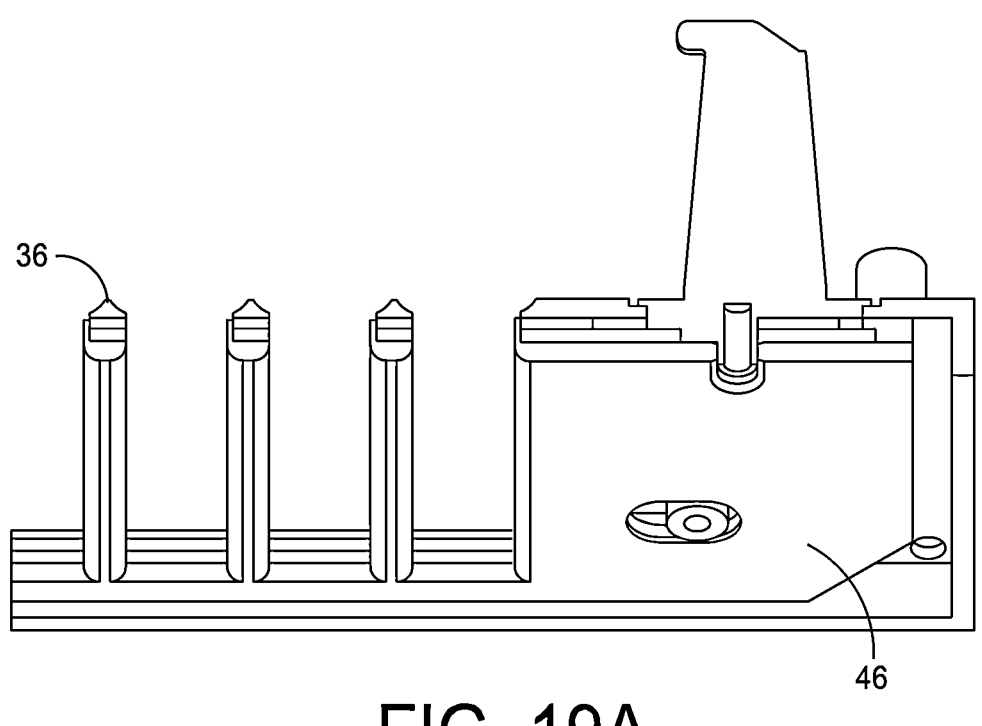
FIG. 19A is a front perspective view of a portion of the grid assembly showing grids of the grid assembly in an open position.
Figure 19B:
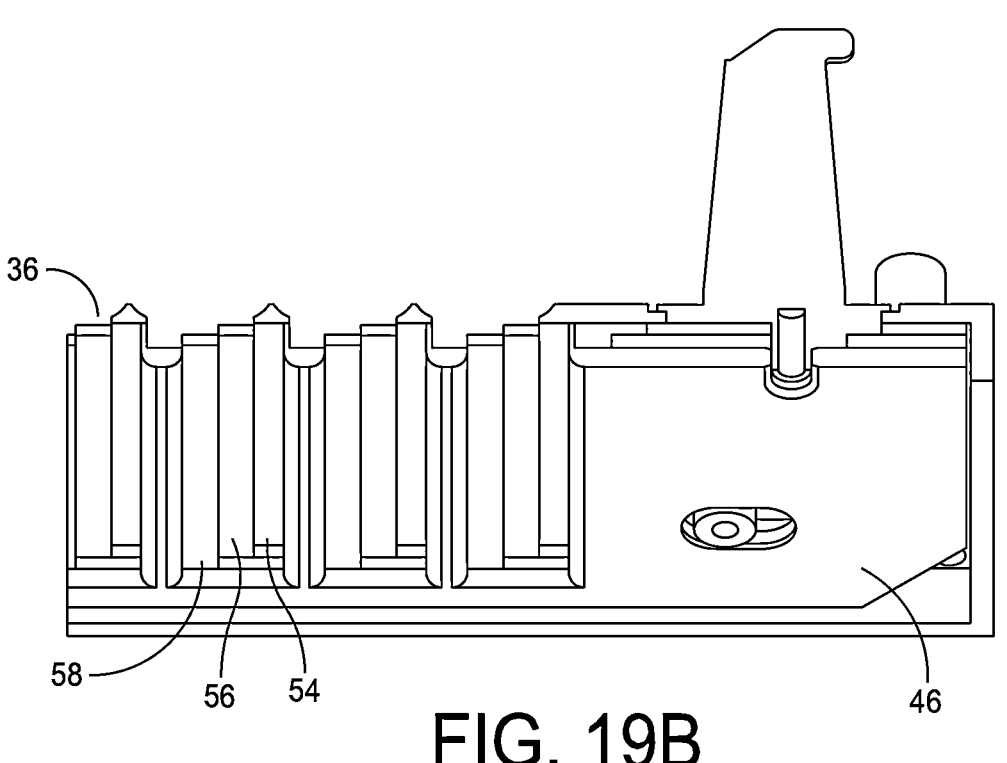
FIG. 19B is a front perspective view of a portion of the grid assembly showing grids of the grid assembly in a closed position.

Referring to FIGS. 19A and 19B, a portion of the grid assembly 36 is shown. FIG. 19A shows the slidable grids 54, 56, 58 in the fully open position. FIG. 19B shows the slidable grids 54, 56, 58 in the fully closed position.

Figure 20A:
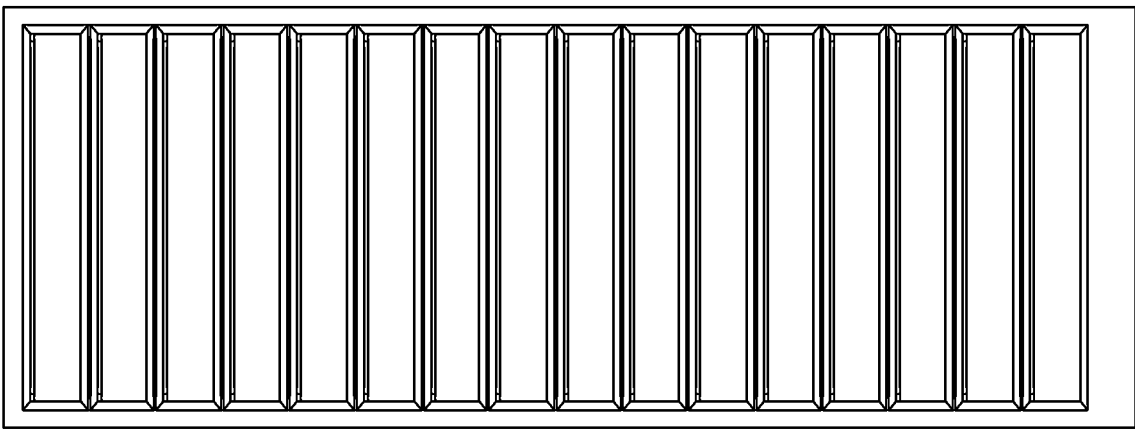
FIG. 20A is a front view of the grid assembly showing grids of the grid assembly in a fully open position.
Figure 20B:
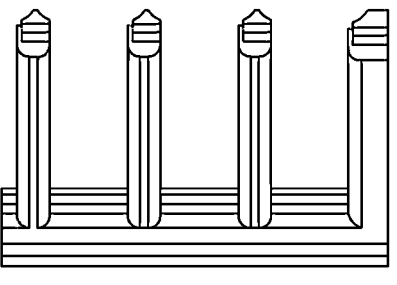
FIG. 20B is a front perspective view of a portion of the grid assembly showing grids of the grid assembly in the fully open position.
Figure 20C:
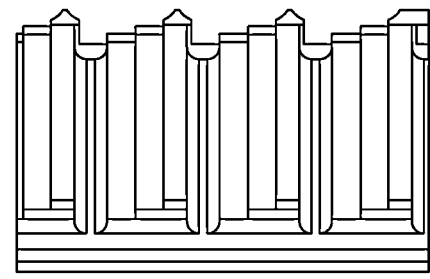
FIG. 20C is a front perspective view of the portion of the grid assembly of FIG. 20B showing grids of the grid assembly in the closed position.

Referring to FIGS. 20A-20C, a ventilation rate of 75% can be achieved by moving the three slidable grids 54, 56, 58 with respect to the fixed grid 46. FIGS. 20A and 20B show the slidable grids 54, 56, 58 and the fixed grid 46 in the fully open position. FIG. 20C shows the slidable grids 54, 56, 58 and the fixed grid 46 in the fully closed position. When different ventilation needs are required, the number of grids can be modified to change the ventilation rate.

Referring to FIG. 21, the shape of the grids when open also can affect the ventilation flow rate. In one embodiment, each grid 108 includes a front side 110, which is configured with a sharp rounded corner. The sharp round corner of the front side 110 of the grid 108 enables a smoother flow rate to reduce drag. As shown, each grid further includes a back side 112 having a round surface.

Referring to FIGS. 22A and 22B, a method of replacing one or more fan units 34 of the fan module 30 is represented. FIG. 22A shows the knob 82 in the locked position, the grid assembly 36 in the fully open position, and the switch 94 in the closed or engaged position. In this position, the first slidable grid 54 engages the switch 94, thereby ensuring power delivered to the fan module 30 by the power module 16. Further, the elongated portion 90 of the knob 82 prevents the fan module subassembly from being removed from the power module. By rotating the knob 82 and moving the slidable grids 54, 56, 58 from the open position to the closed position, the switch 94 is released to deenergize the power module on which the fan module is secured. FIG. 22B shows the knob 82 in the unlocked position, the grid assembly 36 in the fully closed position, and the switch 94 in the released or disengaged position. In this position, the fan module subassembly can be removed by moving the front cover 32 and the fan units 34 away from the grid assembly 36 to access the fan unit(s) 34 for replacement.

The method of installing the fan module subassembly, i.e., the front cover 32 and the fan units 34, includes inserting the pins 78 of the power module 16 through the guide openings 80 of the front cover. Simultaneously, the knob 82 is inserted through the circular opening 44 of the front cover 32, with the elongated portion 90 being received through the slot 92. Once the front cover 32 is installed on the power module 16, the knob 82 is rotated to lock the front cover in place and to engage the switch 94 thereby providing energy to the fan module 30.

Having thus described several aspects of at least one embodiment of this disclosure, it is to be appreciated various alterations, modifications, and improvements will readily occur to those skilled in the art. Such alterations, modifications, and improvements are intended to be part of this disclosure and are intended to be within the spirit and scope of the disclosure. Accordingly, the foregoing description and drawings are by way of example only.

What is claimed is:

1. A fan module, comprising:

a fan cover including an opening;

a fixed grid coupled to the fan cover;

a fan assembly positioned between the fan cover and the fixed grid;

at least one movable grid coupled to the fixed grid, the at least one movable grid being configured to move between an open position in which air flows through the fixed grid and the at least one movable grid and a closed position in which air flow is blocked by the fixed grid and the at least one movable grid; and a knob extending through the fan cover and the fixed grid, the knob being configured to move the at least one movable grid between the open position and the closed position, the knob including an elongated portion, the elongated portion being configured to prevent removal of the fan cover when the at least one movable grid is in the open position and permit removal of the fan cover when the at least one movable grid is in the closed position.

2. The fan module of claim 1, wherein the knob further includes a cam configured to engage the at least one movable grid to move the at least one movable grid between the open position and the closed position when rotating the knob.

3. The fan module of claim 2, wherein the at least one movable grid includes at least two movable grids, each movable grid being configured to be engaged by a portion of the cam.

4. The fan module of claim 3, wherein each movable grid of the at least two movable grids includes an opening that functions as a cam follower when engaged by the portion of the cam to move the movable grid.

5. The fan module of claim 1, further comprising a switch located proximate to the at least one movable grid.

6. The fan module of claim 5, wherein the at least one movable grid is configured to release the switch when moved to the closed position.

7. The fan module of claim 5, wherein the switch, when released by the at least one movable grid, is configured to deenergize a power module on which the fan module is secured.

8. The fan module of claim 5, wherein the switch is a microswitch.

9. The fan module of claim 1, wherein the at least one movable grid includes a plurality of grid members, each grid member having a front sharp corner and a back round surface.

10. A fan module, comprising:

a fan cover including an opening;

a fixed grid coupled to the fan cover;

a fan assembly positioned between the fan cover and the fixed grid;

at least one movable grid coupled to the fixed grid, the at least one movable grid being configured to move between an open position in which air flows through the fixed grid and the at least one movable grid and a closed position in which air flow is blocked by the fixed grid and the at least one movable grid; and a switch, the at least one movable grid is configured to release the switch when moved to the closed position, wherein the switch, when released by the at least one movable grid, is configured to deenergize a power module on which the fan module is secured.

11. The fan module of claim 10, wherein the switch is a microswitch.

12. The fan module of claim 10, further comprising a knob extending through the fan cover and the fixed grid, the knob being configured to move the at least one movable grid between the open position and the closed position.

13. The fan module of claim 12, wherein the knob includes an elongated portion, the elongated portion being configured to prevent removal of the fan cover when the at least one movable grid is in the open position and permit removal of the fan cover when the at least one movable grid is in the closed position.

14. The fan module of claim 12, wherein the knob includes a cam configured to engage the at least one movable grid to move the at least one movable grid between the open position and the closed position when rotating the knob.

15. The fan module of claim 14, wherein the at least one movable grid includes two movable grids, each movable grid being configured to be engaged by a portion of the cam.

16. The fan module of claim 15, wherein each movable grid of the two movable grids includes an opening that functions as a cam follower when engaged by the portion of the cam to move the movable grid.

17. The fan module of claim 10, wherein the at least one movable grid includes a plurality of grid members, each grid member having a front sharp corner and a back round surface.

18. A method of replacing a fan assembly of a fan module of the type having a fan cover, a fixed grid coupled to the fan cover, a fan assembly positioned between the fan cover and the fixed grid, and at least one movable grid configured to move between an open position in which air flows through the fixed grid and the at least one movable grid and a closed position in which air flow is blocked by the fixed grid and the at least one movable grid, the method comprising:

moving the at least one movable grid from the open position to the closed position;

releasing a switch with the at least one movable grid, the at least one movable grid being configured to release the switch when moved to the closed position, wherein the switch, when released by the at least one movable grid, is configured to deenergize a power module on which the fan module is secured; and removing the front cover to access the fan assembly for replacement.

19. The method of claim 18, wherein the switch is a microswitch.

20. The method of claim 18, wherein moving the at least one movable grid includes rotating a knob that extends through the fan cover and the fixed grid, the knob being configured to move the at least one movable grid between the open position and the closed position.

21. The method of claim 20, wherein the knob includes an elongated portion, the elongated portion being configured to prevent removal of the fan cover when the at least one movable grid is in the open position and permit removal of the fan cover when the at least one movable grid is in the closed position.

22. The method of claim 20, wherein the knob includes a cam configured to engage the at least one movable grid to move the at least one movable grid between the open position and the closed position when rotating the knob.

23. The method of claim 22, wherein the at least one movable grid includes at least two movable grids, each movable grid being configured to be engaged by a portion of the cam.

24. The method of claim 23, wherein each movable grid of the at least two movable grids includes an opening that functions as a cam follower when engaged by the portion of the cam to move the movable grid.

25. The method of claim 18, wherein the at least one movable grid includes a plurality of grid members, each grid member having a front sharp corner and a back round surface.

26. The method of claim 18, further comprising, after replacing the fan assembly, installing the fan cover and moving the at least one movable grid from the closed position to the open position.

\* \* \* \* \*